(12) United States Patent
Suzuki et al.

(10) Patent No.: US 8,445,077 B2
(45) Date of Patent: May 21, 2013

(54) METHOD OF PRODUCING COATED MEMBER

(75) Inventors: Masahiro Suzuki, Kashiba (JP); Toshiyuki Saito, Kashiba (JP); Kazuyoshi Yamakawa, Nishinomiya (JP)

(73) Assignee: JTEKT Corporation, Osaka (JP)

( * ) Notice: Subject to any disclaimer, the term of this patent is extended or adjusted under 35 U.S.C. 154(b) by 61 days.

(21) Appl. No.: 13/117,576

(22) Filed: May 27, 2011

(65) Prior Publication Data

US 2011/0293855 A1     Dec. 1, 2011

(30) Foreign Application Priority Data

May 31, 2010  (JP) ................................. 2010-124554

(51) Int. Cl.
*H05H 1/24*  (2006.01)

(52) U.S. Cl.
USPC ............................. 427/577; 427/348; 427/535

(58) Field of Classification Search
USPC ........................................ 427/577, 348, 535
See application file for complete search history.

(56) References Cited

U.S. PATENT DOCUMENTS

| | | | |
|---|---|---|---|
| 5,203,924 A * | 4/1993 | Mitani et al. | 118/719 |
| 5,334,306 A * | 8/1994 | Dautremont-Smith et al. | 205/131 |
| 5,431,963 A * | 7/1995 | Rzad et al. | 427/534 |
| 6,086,962 A * | 7/2000 | Mahoney et al. | 427/577 |
| 6,528,115 B1 * | 3/2003 | Hirano et al. | 427/249.1 |
| 7,514,125 B2 * | 4/2009 | Padhi et al. | 427/569 |
| 2005/0202173 A1 * | 9/2005 | Mills | 427/249.7 |
| 2012/0121817 A1 * | 5/2012 | Saito et al. | 427/535 |

FOREIGN PATENT DOCUMENTS

| | | |
|---|---|---|
| EP | 1 798 305 A1 | 6/2007 |
| JP | 4-304377 | * 10/1992 |
| JP | 10-291895 | * 11/1998 |
| JP | A-2003-14121 | 1/2003 |
| JP | A-2007-162099 | 6/2007 |

OTHER PUBLICATIONS

Chen, Chia-Fu, et al., "Effect of Post-treatment on Electrical Properties of Amorphous Hydrogenated Carbon Films Deposited by Gridless Ion Beam Deposition". Jpn. J. Appl. Phys., vol. 42 (2003) Pt.1, No. 1, pp. 259-262.*
Tamor, M.A., et al., "Atomic constraint in hydrogenated "diamond-like" carbon." Appl. Phys. Lett. 58 (6), Feb. 11, 1991, pp. 592-594.*
Grill, Alfred, "Diamond-like carbon: state of the art". Diamond and Related Materials 8 (1999) 428-434.*
Liu, Dongping, et al., "Plasma-assisted CVD of hydrogenated diamond-like carbon films by low-pressure dielectric barrier discharges." J. Phys. D: Appl. Phys. 34 (2001) 1651-1656.*
Tzeng, Shinn-Shyong et al., "The effects of plasma pre-treatment and post-treatment on diamond-like carbon films synthesized by RF plasma enhanced chemical vapor depositin", VACUUM, (2009), vol. 83, No. 3, ISSN: 0042-207X, pp. 618-621.
Nov. 29, 2012 European Search Report issued in European Patent Application No. 11168034.4.

* cited by examiner

*Primary Examiner* — Bret Chen
(74) *Attorney, Agent, or Firm* — Oliff & Berridge, PLC

(57) ABSTRACT

A method of producing a coated member in which a base material surface is at least partially coated with a diamond-like carbon film, the method includes: a diamond-like carbon film deposition process in which a diamond-like carbon film is formed on a surface of the base material by generating plasma by applying voltage to the base material in a processing chamber that stores the base material, while evacuating the processing chamber and introducing feedstock gas that contains at least a carbon compound into the processing chamber; and a hydrogenation process in which the deposited diamond-like carbon film is hydrogenated using hydrogen gas by stopping the voltage application and introducing hydrogen gas inducted instead of the feedstock gas, while the evacuation is being continued.

30 Claims, 3 Drawing Sheets

METHOD OF PRODUCING COATED MEMBER

INCORPORATION BY REFERENCE

The disclosure of Japanese Patent Application No. 2010-124554 filed on May 31, 2010 including the specification, drawings and abstract is incorporated herein by reference in its entirety.

BACKGROUND OF THE INVENTION

1. Field of the Invention

The present invention relates to methods of producing coated members whose base material surfaces are at least partly coated with a diamond-like carbon (DLC) film.

2. Description of the Related Art

To improve the fuel economy of an automobile, it is necessary to reduce friction of sliding portions formed on various components provided in the automobile. To do so, the surface of a base material that forms the sliding portions may be coated with a PLC film having low friction and wear resistance (high hardness) properties. The DLC film is formed, for example, by a plasma chemical vapor deposition (CVD) method. That is, a processing chamber for storing base materials is evacuated, and then a feedstock gas that includes hydrogen gas, argon gas, and hydrocarbons such as methane is continuously inducted in the processing chamber while the pressure in the processing chamber is maintained at a prescribed pressure. Then, voltage is applied to the base material in order to produce plasma in the processing chamber. Accordingly, ions and radicals are generated from the feedstock gas, and chemical reactions are initiated in order to deposit a DLC film, mainly composed of carbon (C), on the surface of the base material.

Plasma CVD methods employed here include a direct plasma CVD method and a direct-current (DC) pulse plasma CVD method in which DC pulse voltage is applied. A problem with the DLC film is that adaptation in an initial use period (hereinafter referred to as "initial adaptation") is bad. This is likely because the surface of the DLC film lacks smoothness just after it is formed, and it is difficult to gain lubricity later on either. If initial adaptation of the DLC film is bad, the DLC film would be separated by friction in its initial use period. Also, the friction would damage the surface layer of a member that contacts the DLC layer. For the above reasons, DLC coated parts must undergo an adaptation process in which rubbing the DLC layer in advance is repeated before being actually used.

There have been proposed improved coating structures in which a film having good initial adaptation is formed on the surface of the DLC film in order to eliminate and reduce the adaptation process. The adaptation film related techniques are disclosed for example in Japanese Patent Application Publication No. 2007-162099 (JP-A-2007-162099) and Japanese Patent Application Publication No. 2003-14121 (JP-A-2003-14121). In JP-A-2007-162099, a structure in which a graphite layer is formed on the DLC film surface is proposed. In SP-A-2003-14121, a structure in which another DLC film containing silicon (Si) of 50 to 70% by mass is formed on the DLC film is proposed.

The both of JP-A-2007-162099 and SP-A-2003-14121 require a process of forming a DLC film on the base material surface and a process of forming an adaptation film on the DLC film surface, which increases the number of processes needed for producing a single coating member. It increases energy consumption and reduces productivity of coated member because of the increased production time needed along with the increase of the number of processes. Also, because the structures of JP-A-2007-162099 and JP-A-2003-14121 are both formed by laminating two discontiguous layers that differ in physical properties, such as thermal expansion coefficient and hardness, a sliding portion for example would suffer from separation and cracks on any layer, and a soft adaptation film would suffer particularly from abrasion at an early stage.

SUMMARY OF THE INVENTION

The present invention provides a method of producing coated member that does not require a process of forming a separate and independent adaptation film on a surface of a DLC film, and that provides superior initial adaptation with low consumption energy and high productivity.

The aspect of the present invention is related to a method of producing a coated member in which a base material surface is at least partially coated with a diamond-like carbon film, which includes: a diamond-like carbon film deposition process in which the diamond-like carbon film is formed on a surface of the base material by generating plasma by applying voltage to the base material in a processing chamber that stores the base material, while evacuating the processing chamber and introducing feedstock gas that contains at least a carbon compound into the processing chamber; and a hydrogenation process in which the deposited diamond-like carbon film is hydrogenated using hydrogen gas by stopping the voltage application and introducing hydrogen gas inducted instead of the feedstock gas, while the evacuation is being continued.

According to the above aspect, the DLC film with a certain thickness is first formed in a processing chamber in a DLC film fog nation process, and then hydrogen gas instead of feedstock gas is inducted into the processing chamber to perform hydrogenation process, and initial adaptation of the DLC film itself can be improved by at least one of the following mechanisms.

(1) Hydrogen is diffused through a surface layer of the DLC film to form a hydrogen diffusion area with a good adaptation.

(2) Hydrogen acts on carbon-carbon bonds that forms the surface layer and increases a ratio of sp2 bond (graphite bond), whose bonding force is weaker than sp3 bond (diamond bond). Thereby, the surface exhibits a good adaptation and soft graphite properties.

(3) Reduction function of hydrogen reduces and removes unnecessary molecular chains in the DLC film surface and prevents impurity contamination, so that the smoothness and adaptation of the surface is improved.

The reactions in the hydrogenation process only requires inducting hydrogen gas, instead of feedstock gas, into the processing chamber in the state where voltage application is stopped while evacuation is continued. The reactions can mainly be continued with residual heat of the DLC film formation process. Therefore, the coated member having superior initial adaptation can be produced with low consumption energy and high productivity without undergoing the process of forming the separate adaptation film on the surface of the DLC film.

According to the above aspect, it can be provided a method for producing a coated member, superior in initial adaptation, with low consumption energy and high productivity without undergoing a process of forming a separate adaptation film on a surface of the DLC film.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Figure 1:
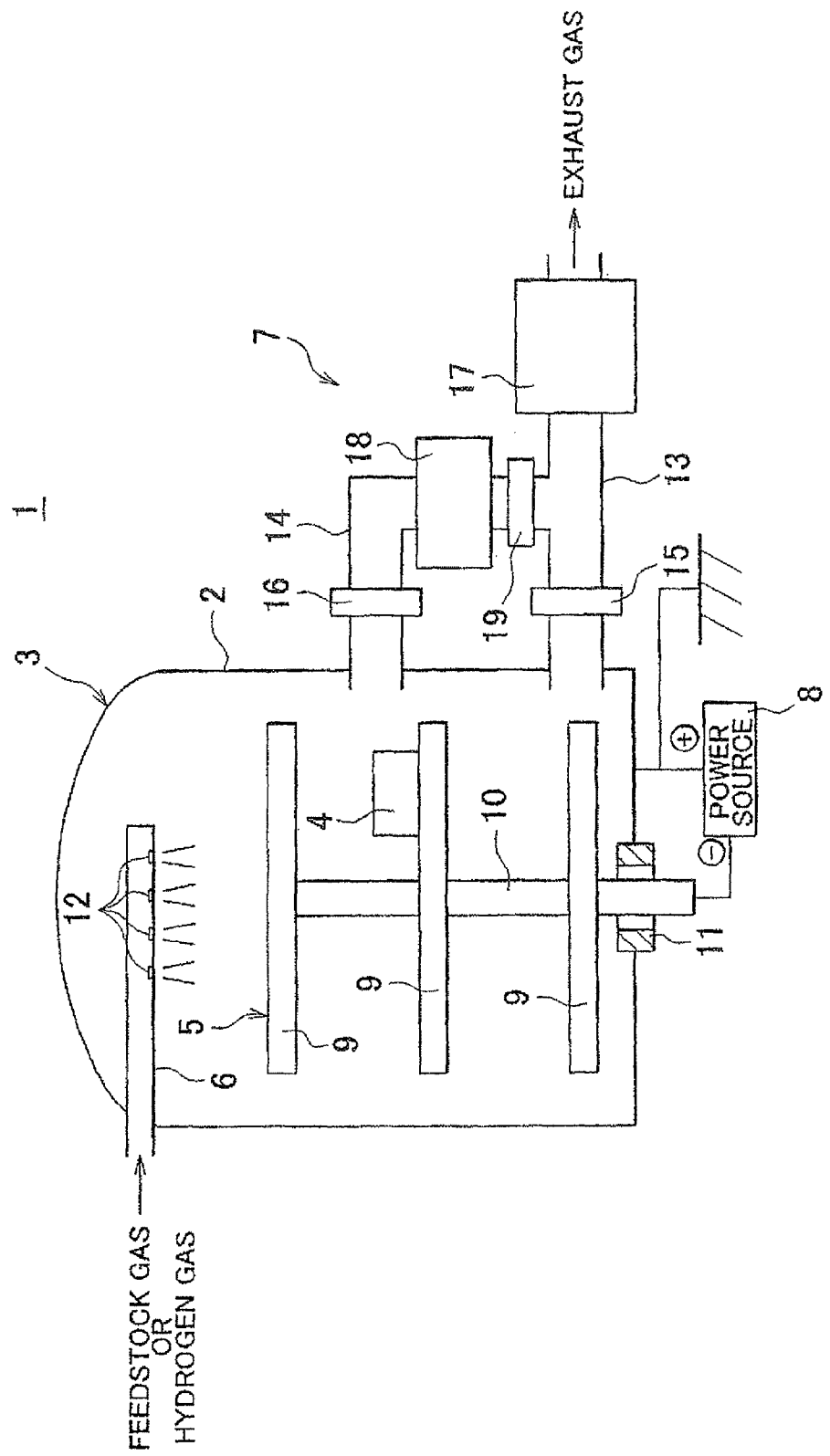
FIG. 1 is a schematic cross sectional view that shows an example of a plasma CVD device used in producing a coated member according to an embodiment of the present invention.

An embodiment of the present invention will be described below with reference to the drawings. FIG. 1 is a schematic cross sectional view of the structure of a plasma Chemical Vapor Deposition (CVD) device 1 used in producing a coated member of the present invention. The plasma CVD device 1 employs the DC pulse plasma CVD method or DC plasma CVD method to produce a coated member. The plasma CVD device 1 shown in FIG. 1 includes a processing chamber 3 that is surrounded by a partition wall 2; a base 5, provided in the processing chamber 3, that holds the base material 4 of the coated member; a feedstock gas inlet pipe 6 that inducts a feedstock gas or hydrogen gas into the processing chamber 3; an exhaust system 7 that evacuates the processing chamber 3; and a power source 8 that generates DC pulse voltage or DC voltage to generate plasma from the gas inducted into the processing chamber 3.

The base 5 includes a support plate 9 that is arranged horizontally and a support shaft 10 that extends vertically and supports the support plate 9. The base 5 in this embodiment has three tiers, in which three support plates 9 are arranged vertically. The base 5 is formed entirely from an electrically conductive material, such as copper. The base 5 is connected an anode of the power source 8.

The partition wall 2 of the processing chamber 3 is formed from an electrically conductive material such as stainless steel. The partition wall 2 is connected to the cathode of the power source 8. The partition wall 2 is provided with ground connection. The partition wall 2 is insulated from the base 5 by an insulation member 11. Thus, the partition wall 2 is grounded. When the power source 8 is turned on to generate DC pulse voltage or DC voltage, an electric potential is generated between the partition wall 2 and the base 5.

The feedstock gas inlet pipe 6 extends horizontally above the base 5 in the processing chamber 3. A number of feedstock gas-discharge holes 12 are formed in the feedstock gas inlet pipe 6 along the length of the feedstock gas inlet pipe 6 that face toward the base 5. The feedstock gas is inducted in the processing chamber 3 through the feedstock gas-discharge hole 12. The gas inducted in the feedstock gas inlet pipe 6 contains at least a carbon compound as a component gas. The feedstock gas inlet pipe 6 is connected with a plurality of branched inlet pipes (not shown) that induct each component gas from its supply source (gas canister, liquid container, etc.) to the processing chamber 3. The branched inlet pipes are each provided with a flow rate control valve (not shown) or the like that controls the flow rate of the component gas from the supply source. A liquid container in the supply source is provided with a heating means (not shown) for heating a liquid as necessary.

The exhaust system 7 includes a first exhaust pipe 13 and a second exhaust pipe 14 that are both communicated with the processing chamber 3; a first on-off valve 15; a second on-off valve 16; a third on-off valve 19; a first pump 17; and a second pump 18. The first on-off valve 15 and the first pump 17 are disposed, in the stated order from the processing chamber 3, in a middle portion of the first exhaust pipe 13. A low vacuum pump such as an oil-sealed rotary vacuum pump (rotary pump) and a diaphragm vacuum pump may be used as the first pump 17. An oil-sealed rotary vacuum pump is a positive-displacement pump that reduces an airtight space and an ineffective space between parts, for example, a rotor, a stator, and a slide vane, by using oil. Suitable oil-sealed rotary vacuum pumps that may be used as the fast pump 17 include, for example, rotary vane oil-sealed rotary vacuum pumps and rolling piston vacuum pumps.

One end of the second exhaust pipe 14 is connected to the middle portion of the first exhaust pipe 13, between the first on-off valve 15 and the first pump 17. The second on-off valve 16, the second pump 18, and the third on-off valve 19 are disposed, in the stated order from the processing chamber 3, in a middle portion of the second exhaust pipe 14. A high vacuum pump such as a turbo molecular pump or an oil diffusion pump may be used as the second pump 18.

Figure 2:
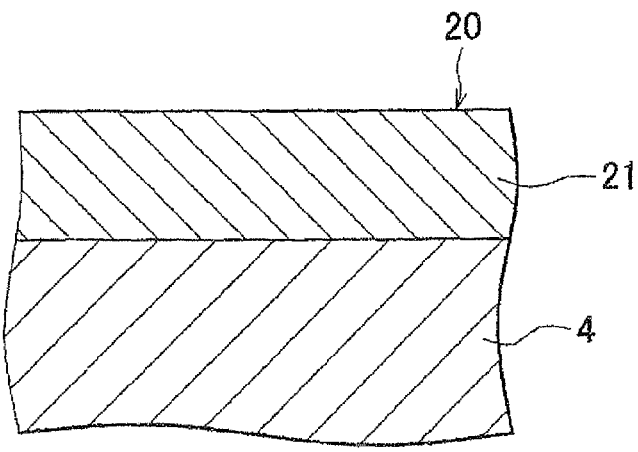
FIG. 2 is a cross sectional view that shows the surface layer of the coated member produced in the plasma CVD device according to a method of producing the coated member of the present invention.

FIG. 2 is a cross sectional view of the surface layer of the coated member 20 produced by using the plasma CVD device 1. As shown in FIG. 2, the coated member 20 includes the base material 4 and a diamond-like carbon (DLC) film 21 deposited on the surface of the base material 4. If for example the coated member 20 is used as a sliding portion provided in en automobile, the base material 4 should be made of a steel material, such as tool steel, carbon steel, or stainless steel, that is generally used for forming the sliding portion. In this case, the thickness of the DLC film 21 may be, for example, about 0.1 to 10.0 μm.

The following describes the evacuation process for producing the coated member 20 by forming the DLC film 21 on the surface of the base material 4 with the use of the plasma CVD device 1. First, the base material 4 is placed on the support plate 9 of the base 5 in the processing chamber 3. Then, the first pump 17 is driven while the first, second, third on-off valves 15, 16, 19 are closed, and then the first on-off valve 15 is opened in order to evacuate the processing chamber 3. When the processing chamber 3 is evacuated up to a first specified vacuum pressure by the first pump 17, the first on-off valve 15 is closed, and at the same time the third on-off valve 19 is opened and the second pump 18 is driven. Then, the second on-off valve 16 is opened in order to further evacuate the processing chamber 3 by the first pump 17 and the second pump 18.

When the processing chamber 3 reaches a second specified vacuum pressure, the second on-off valve 16 is closed and the second pump 18 is stopped. Then, the third on-off valve 19 is closed and the first on-off valve 15 is opened. While the first pump 17 continues to evacuate the processing chamber, the feedstock gas is inducted from the supply source (not shown) through the gas inlet pipe 6 to the processing chamber 3. The feedstock gas used may include, for example, carbon compounds combined with hydrogen gas, argon gas, etc. Hydrogen gas and argon gas stabilize the plasma. Argon gas also serves to press the carbon (C) laminated on the surface of the base material 4 to harden the DLC film 21.

Carbon compounds used may include at least one kind of hydrocarbon, gas or low-boiling-point liquid under normal temperature and pressure, such as methane (CH4), acetylene (C2H2), and benzene (C6H6). Organosilicon compounds such as tetramethylsilane (Si(CH3)4) may be added to the feedstock gas. According to this configuration, the initial adaptation can further be improved by doping the DLC film 21 with Si. To improve the initial adaptation, the concentration of Si in the DLC film 21 may be, for example, 7% by mass or more and 30% by mass or less, preferably about 20% by mass.

The flow rate control valve of the branched inlet pipe (not shown) for each component gas is regulates the flow rate of each component gas and the total flow of feedstock gas, and then the feedstock gas is inducted through the feedstock gas inlet pipe 6 into the processing chamber 3. Then, the pressure in the processing chamber 3 is adjusted to, for example, 100 Pa or more and 400 Pa or less, preferably about 200 Pa. The partial pressure of the carbon compounds may be adjusted to about 50% of the pressure.

Next, the DLC film deposition process for producing the coated member 20 in which the DLC film 21 is formed on the surface of the base material 4 by using the plasma CVD device 1 will be described. The power source 8 is turned on to generate an electric potential difference between the partition wall 2 and the base 5, and plasma is thus generated in the processing chamber 3. In the DC pulse plasma CVD method, for example, when the power source 8 is turned on, DC pulse voltage is applied between the partition well 2 and the base 5 to produce plasma. The plasma then generates ions and radicals from the feedstock gas in the processing chamber 3, and the ions and the radicals are attracted to the surface of the base material 4 due to the electric potential difference. Then, chemical reactions occur on the surface of the base material 4, and the DLC film 21 is deposited on the surface of the base material 4.

Figure 3:
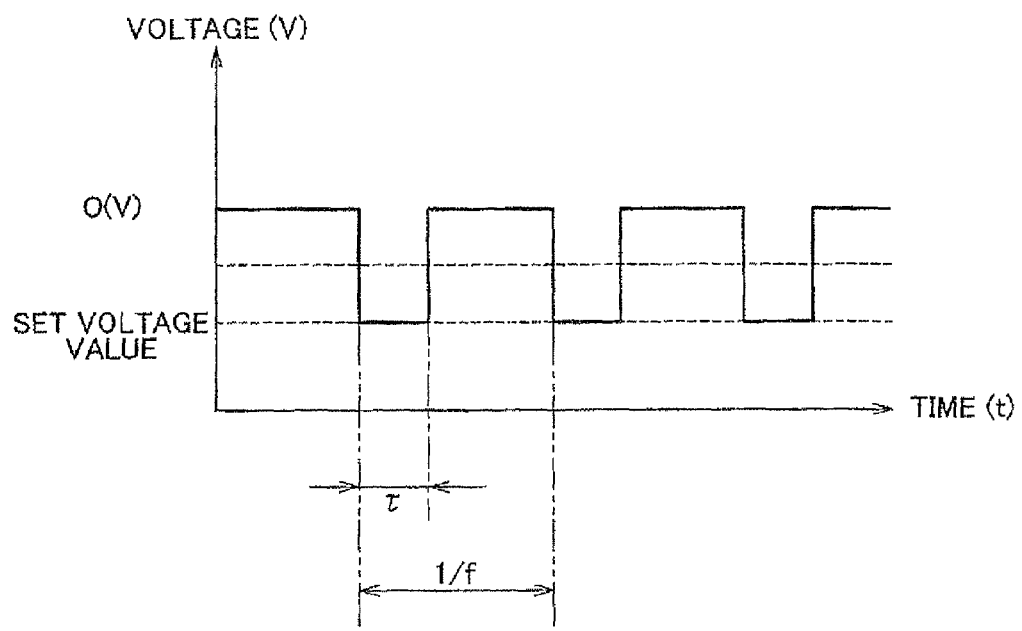
FIG. 3 is a graph that shows an example of a waveform of a DC pulse voltage applied to a base material from the power source of the plasma CVD device.

FIG. 3 is a graph that shows an example of a waveform of DC pulse voltage applied from the power source 8 to the base material 4. The DC pulse voltage may be set to about −1,000 V, for example. When the power supply 8 is turned on, an electric potential difference of 1,000 V is generated between the partition wall 2 and the base 5. In other words, 1,000 V of negative DC pulse voltage is applied to the base material 4 placed on the base 5, and the base material 4 functions as an anode. Because the electric potential applied by the plasma CVD device 1 is a pulse, abnormal electrical discharge is not generated in the processing chamber 3, even when the high voltages indicated above are applied between the partition wall 2 and the base 5. Accordingly, the method described can prevent a temperature rise of the base material 4 and maintains the process temperature at or below 300° C.

For the DC pulse voltage, the duty ratio may be set to 5% or more, preferably set to about 50%. Here, the duty ratio is obtained by dividing the pulse width τ by the pulse period represented as a reciprocal (1/f) of the frequency f. That is, the duty ratio is obtained by multiplying the pulse width τ by the frequency f as shown in the following equation (1).

$$\text{Duty ratio} = \tau \times f \quad (1)$$

The frequency f may be set to 200 Hz or more and 2,000 Hz or less, preferably about 1,000 Hz.

According to the above embodiment, the deposition speed of the DLC film 21 may be further increased to improve productivity of the coated member 20. In addition, damage to the base material 4 that forms the coated member 20 is further reduced.

In the present embodiment, a DC plasma CVD method may also be used. That is, when the power source 8 is turned on, DC voltage is applied between the partition wall 2 and the base 5 to produce plasma. The plasma then generates ions and radicals from the feedstock gas in the processing chamber 3, and the ions and the radicals are attracted to the surface of the base material 4 due to the electric potential difference. Then, chemical reactions occur on the surface of the base material 4, and the DLC film 21 is deposited on the surface of the base material 4.

The following description shows a hydrogenation process for producing the coated member 20 by forming the DLC film 21 on the surface of the base material 4 by using the plasma CVD device 1. Once the DLC film 21 has reached a prescribed thickness on the surface of the base material 4, the power source 8 is turned off to stop feedstock gas induction. Then, hydrogen gas alone is inducted into the processing chamber 3 for hydrogenation.

In the hydrogenation process, hydrogen inducted in the processing chamber 3 further improves the initial adaptation of the DLC film based on at least one of the following mechanisms (1) to (3).

(1) Hydrogen diffuses through a surface layer of the DLC film to form a hydrogen diffusion area that has a good adaptation.
(2) Hydrogen acts on carbon-carbon bonds at the surface layer, and increases the ratio of sp2 bond (graphite bond), which have a weaker bonding force than sp3 bond (diamond bond). Accordingly, the surface layer exhibits increased adaptation and soft graphite property.
(3) Unnecessary molecular chains in the DLC film surface are reduced and removed and contamination with impurities is prevented by hydrogen reduction, and therefore smoothness and adaptation of the DLC film surface is improved.

The reactions described above only require inducting hydrogen gas, instead of feedstock gas, into the processing chamber in the state where voltage application is stopped while evacuation is continued. The reactions can be continued with mainly the use of residual heat of the DLC film deposition process. The pressure in the processing chamber 3 during the hydrogenation process may be adjusted to, for example, 100 Pa or more and 400 Pa or less, preferably about 200 Pa. Accordingly, the processing chamber 3 is filled with a sufficient amount of hydrogen gas, and the reaction is performed smoothly.

Hydrogenation is performed while residual heat from the DLC film deposition process is present, for example while the temperature of the base material 4 is 100° C. or more. The hydrogenation time may be, for example, about 1 minute or more and 7 minutes or less. The hydrogenation process is performed concurrently with cooling of the base material after DLC film formation, for example. Accordingly, the coated member 20 may be produced with lower consumption energy and higher productivity. That is, the coated member 20 can be produced with almost the same consumption energy and the same productivity as the case in which the coated member is produced by simply depositing a DLC film on the surface of the base material 4.

Next, a cooling process used in process of producing the PLC-coated member 20 will be described. When the induction of hydrogen as is stopped and hydrogenation is completed; the coated member 20 is cooled to room temperature while the evacuation by the first pump 17 is continued.

Finally, the first on-off valve 15 is closed, and instead a leak valve (not shown) is opened, and outside air is inducted into the processing chamber 3 to recover normal pressure in the processing chamber 3. Then, the processing chamber is opened, and the base member 4 is removed. Accordingly, the coated member 20, in which the surface of the base member 4 is at least partially coated with the DLC film 21, is produced.

The coated member 20 may be, for example, a clutch plate, the worm of a steering device (the DLC film is deposited on a tooth flank), an inner/outer ring of a bearing (the DLC film is deposited on an orbital plane) and a bearing cage, a propeller shaft (the DLC film is deposited on a drive shaft, a male spline, and/or female spline). The surface of the base material 4 may be subjected to an ion bombardment treatment before the DLC film 21 is deposited on the surface of the base material 4. In the ion bombard treatment, the power source 8 is turned on while argon gas and hydrogen gas is inducted in the processing chamber 3 in order to generate plasma. Accordingly, the plasma generates ions and radicals from argon gas in the processing chamber 3. The resulting ions and radicals strike the surface of the base material 4 due to the difference in electric potential, thereby remove foreign elements adsorbed on the surface of the base material 4 through sputtering, activate the surface, and reform the atomic structure.

Accordingly, it improves peel strength, decreases friction, and improves wear resistance of the DLC film 21 deposited by plasma CVD method. The DLC film 21 does not have to be deposited directly on the surface of the base material 4. A nitride film formed with SiN, CrN, etc. and an intermediated layer formed with Cr, Ti, SiC etc. may be arranged between the surface of the base material 4 and the DLC film 21.

While the invention has been described with reference to example embodiments thereof, it is to be understood that the invention is not limited to the described embodiments. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

Next, examples and a comparative example are described. In the examples and the comparative example, the DLC film 21 is deposited on the surface of a base material 4 made of tool steel (SKH4 by Japanese Industrial Standards (JIS)) using the plasma CVD device 1 shown in FIG. 1. The feedstock gas used in the examples is a mixture of hydrogen gas, argon gas, and methane gas.

The power source 8 generates the DC pulse voltage, and the DC pulse voltage, frequency, and duty ratio are set as −1,000 V, 1,000 Hz, and 10%, respectively. The processing chamber 3 is evacuated through the above-mentioned procedure, argon gas and hydrogen gas is inducted, the power source 8 is turned on, plasma is generated in the processing chamber 3, ion bombard treatment is performed, feedstock gas is inducted, and the pressure in the processing chamber 3 is adjusted to 200 Pa. Then the power source 8 is turned on again to generate plasma in the processing chamber 3, and the DLC film 21 is deposited on the surface of the base material 4 by the DC pulse plasma CVD method.

The power source 8 is turned off and at the same time the induction of the feedstock gas is stopped, and hydrogen gas is inducted. In addition, the pressure in the processing chamber 3 is adjusted to 200 Pa. Hydrogenation was performed for minute for the example 1 and 5 minutes for the example 2, and then induction of hydrogen gas was stopped. While evacuation was continued, the processing chamber 3 is cooled to ambient temperature to finally form the coated member 20.

In the comparative example, after induction of the feedstock gas is stopped, hydrogen gas is not inducted; the processing chamber is then cooled to room temperature to form the coated member while evacuation was being continued.

The thickness of the DLC film 21 prepared in the examples and the comparative example are 1.5 to 3.5 μm, respectively.

A frictional wear test was conducted on the DLC coated members produced in the examples and the comparative example. A ball-on-plate reciprocating friction coefficient tester was used as a testing device. A 4.8 mm diameter steel ball (bearing steel ball made of SUJ2 according to MS standards) is used as the member that contacts the DLC film. The coated members of the example and the comparative example, and the DLC coated surfaces of the coated members were tested. The samples were set in the tester and subjected to a 290-second unlubricated frictional wear test, in which the gliding frequency was 2 Hz, the stroke was 10 mm, and the load was 10 N. Frictional coefficients were measured at test start second) and at 10 second intervals thereafter.

Figure 4:
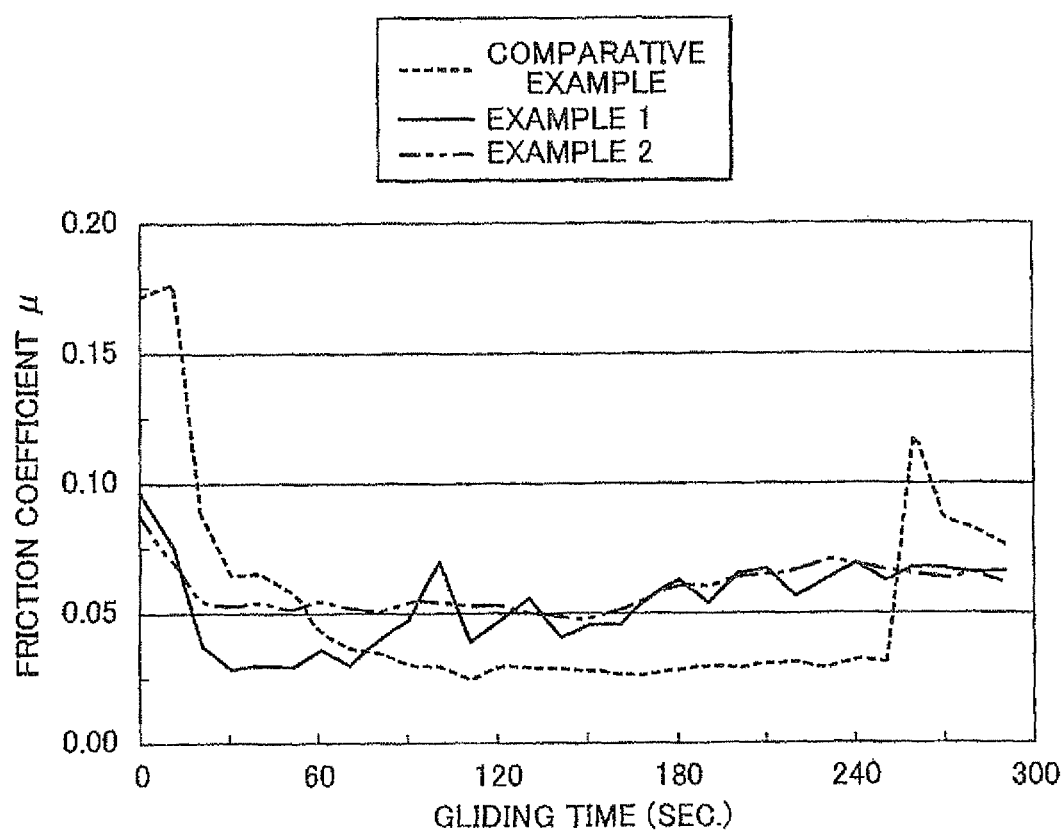
FIG. 4 is a graph that shows the correlation between the friction coefficients and gliding time of the coated member produced in examples and a comparative example.

The correlation between the gliding time (elapsed time from test start) in the frictional wear test and the friction coefficient μ is shown in FIG. 4. As can be seen in FIG. 4, initial friction coefficients up to 30 seconds of gliding time could be reduced by inducting hydrogen gas after DLC film deposition and treating the DLC film accordingly. Thus, demonstrating that initial adaptation is improved by the hydrogenation process.

What is claimed is:

1. A method of producing a coated member in which a base material surface is at least partially coated with a diamond-like carbon film, the method comprising:
a diamond-like carbon film deposition process in which the diamond-like carbon film is formed on a surface of the base material by generating plasma by applying voltage to the base material in a processing chamber that stores the base material, while evacuating the processing chamber and introducing feedstock gas that contains at least a carbon compound into the processing chamber; and
a hydrogenation process in which the deposited diamond-like carbon film is hydrogenated using hydrogen gas by stopping the voltage application and introducing hydrogen gas inducted instead of the feedstock gas, while the evacuation is being continued,
wherein:
the hydrogenation process is performed simultaneously with cooling of the base material that is after the diamond-like carbon film deposition process.

2. The method of producing a coated member according to claim 1, wherein the feedstock gas further contains at least one of hydrogen gas and argon gas.

3. The method of producing a coated member according to claim 1, wherein the feedstock gas is chosen from at least one of methane ($CH_4$), acetylene ($C_2H_2$), and benzene ($C_6H_6$).

4. The method of producing a coated member according to claim 1, wherein the feedstock gas further includes a silicon compound.

5. The method of producing a coated member according to claim 4, wherein the silicon compound is tetramethylsilane ($Si(CH_3)_4$)).

6. The method of producing a coated member according to claim 4, wherein the concentration of the silicon compound is between 7% and 30% by mass inclusive.

7. The method of producing a coated member according to claim 6, wherein the concentration of the silicon compound is substantially 20% by mass.

8. The method of producing a coated member according to claim 1, wherein the plasma is generated by applying DC pulse voltage to the base material in the diamond-like carbon film deposition process.

9. The method of producing a coated member according to claim 8, wherein a duty ratio of the DC pulse voltage is at least 5%.

10. The method of producing a coated member according to claim 9, wherein a duty ratio of the DC pulse voltage is about 50%.

11. The method of producing a coated member according to claim 1, wherein pressure in the processing chamber during the hydrogenation process is between about 100 Pa and 400 Pa inclusive.

12. The method of producing a coated member according to claim 11, wherein the pressure in the processing chamber during the hydrogenation process is substantially 200 Pa.

13. The method of producing a coated member according to claim 1, wherein the hydrogenation process is performed when residual heat of the diamond-like carbon film deposition process is at least at a certain temperature.

14. The method of producing a coated member according to claim 13, wherein the certain temperature is substantially 100° C.

15. The method of producing a coated member according to claim 1, wherein the hydrogenation process is performed for substantially 1 minute to substantially 7 minutes.

16. A method of producing a coated number in which a base material surface is at least partially coated with a diamond-like carbon film, the method comprising:
a diamond-like carbon film deposition process in which the diamond-like carbon film is formed on a surface of the base material by generating plasma by applying voltage to the base material in a processing chamber that stores the base material, while evacuating the processing chamber and introducing feedstock gas that contains at least a carbon compound into the processing chamber; and
a hydrogenation process in which the deposited diamond-like carbon film is hydrogenated using hydrogen gas by stopping the voltage application through the hydrogenation process and introducing hydrogen gas inducted instead of the feedstock gas, while the evacuation is being continued.

17. The method of producing a coated member according to claim 16, wherein the feedstock gas further contains at least one of hydrogen gas and argon gas.

18. The method of producing a coated member according to claim 16, wherein the feedstock gas is chosen from at least one of methane ($CH_4$), acetylene ($C_2H_2$), and benzene ($C_6H_6$).

19. The method of producing a coated member according to claim 16, wherein the feedstock gas further includes a silicon compound.

20. The method of producing a coated member according to claim 19, wherein the silicon compound is tetramethylsilane ($Si(CH_3)_4$)).

21. The method of producing a coated member according to claim 19, wherein the concentration of the silicon compound is between 7% and 30% by mass inclusive.

22. The method of producing a coated member according to claim 21, wherein the concentration of the silicon compound is substantially 20% by mass.

23. The method of producing a coated member according to claim 16, wherein the plasma is generated by applying DC pulse voltage to the base material in the diamond-like carbon film deposition process.

24. The method of producing a coated member according to claim 23, wherein a duty ratio of the DC pulse voltage is at least 5%.

25. The method of producing a coated member according to claim 24, wherein a duty ratio of the DC pulse voltage is about 50%.

26. The method of producing a coated member according to claim 16, wherein pressure in the processing chamber during the hydrogenation process is between about 100 Pa and 400 Pa inclusive.

27. The method of producing a coated member according to claim 26, wherein the pressure in the processing chamber during the hydrogenation process is substantially 200 Pa.

28. The method of producing a coated member according to claim 16, wherein the hydrogenation process is performed when residual heat of the diamond-like carbon film deposition process is at least at a certain temperature.

29. The method of producing a coated member according to claim 28, wherein the certain temperature is substantially 100° C.

30. The method of producing a coated member according to claim 16, wherein the hydrogenation process is performed for substantially 1 minute to substantially 7 minutes.

* * * * *